United States Patent
Holland et al.

[11] Patent Number: 5,759,280
[45] Date of Patent: Jun. 2, 1998

[54] INDUCTIVELY COUPLED SOURCE FOR DERIVING SUBSTANTIALLY UNIFORM PLASMA FLUX

[75] Inventors: John Patrick Holland, Santa Clara; Michael S. Barnes, San Francisco, both of Calif.

[73] Assignee: LAM Research Corporation, Fremont, Calif.

[21] Appl. No.: 662,732

[22] Filed: Jun. 10, 1996

[51] Int. Cl.$^6$ .................................. C23C 16/00
[52] U.S. Cl. .................... 118/723 I; 118/723 IR
[58] Field of Search ............. 118/723 I, 723 IR, 118/723 E, 723 ER, 723 MP; 156/345; 204/298.08, 298.34

[56] References Cited

U.S. PATENT DOCUMENTS

| | | | |
|---|---|---|---|
| 4,340,482 | 7/1982 | Sternberg | 210/500.2 |
| 4,612,077 | 9/1986 | Tracy et al. | 156/345 |
| 4,615,755 | 10/1986 | Tracy et al. | 156/345 |
| 4,617,079 | 10/1986 | Tracy et al. | 156/345 |
| 4,948,458 | 8/1990 | Ogle | 156/643 |
| 5,198,718 | 3/1993 | Davis et al. | 313/359.1 |
| 5,234,529 | 8/1993 | Johnson | 156/345 |
| 5,241,245 | 8/1993 | Barnes et al. | 315/111.41 |
| 5,261,962 | 11/1993 | Hamamoto et al. | 118/723 |
| 5,304,279 | 4/1994 | Coultas et al. | 156/345 |
| 5,368,710 | 11/1994 | Chen et al. | 204/192.32 |
| 5,401,350 | 3/1995 | Patrick et al. | 156/345 |
| 5,405,480 | 4/1995 | Benzing et al. | 156/345 |
| 5,433,812 | 7/1995 | Cuomo et al. | 156/345 |
| 5,525,159 | 6/1996 | Hama et al. | 118/723 I |
| 5,529,657 | 6/1996 | Ishii | 156/345 |
| 5,540,824 | 7/1996 | Yin et al. | 204/298.34 |
| 5,558,722 | 9/1996 | Okumura et al. | 118/723 I |

FOREIGN PATENT DOCUMENTS

| | | |
|---|---|---|
| 0 517 042 A1 | 12/1992 | European Pat. Off. |
| 0596551 | 5/1994 | European Pat. Off. |
| 0694949 | 1/1996 | European Pat. Off. |
| 0710055 | 5/1996 | European Pat. Off. |
| 8-83695 | 3/1996 | Japan |
| 8-148476 | 6/1996 | Japan |

*Primary Examiner*—Jey Tsai
*Assistant Examiner*—Joni Y. Chang
*Attorney, Agent, or Firm*—Lowe, Price, LeBlanc & Becker

[57] ABSTRACT

A planar coil exciting a plasma of an r.f. vacuum plasma processor for a workpiece processed surface in a chamber includes plural turns. The coil, chamber and workpiece are arranged to produce in the chamber a magnetic flux having substantially greater density in peripheral portions of the coil and chamber than in a center portion of the chamber and coil so a substantially uniform plasma flux is incident on a processed surface of the workpiece.

31 Claims, 4 Drawing Sheets

Figure 5A
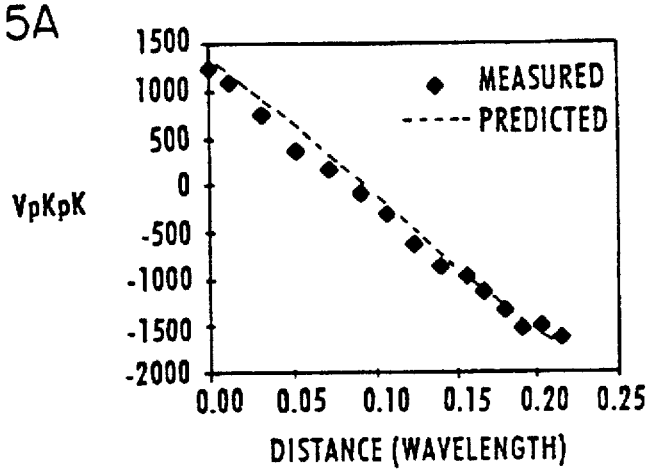
Figure 5B
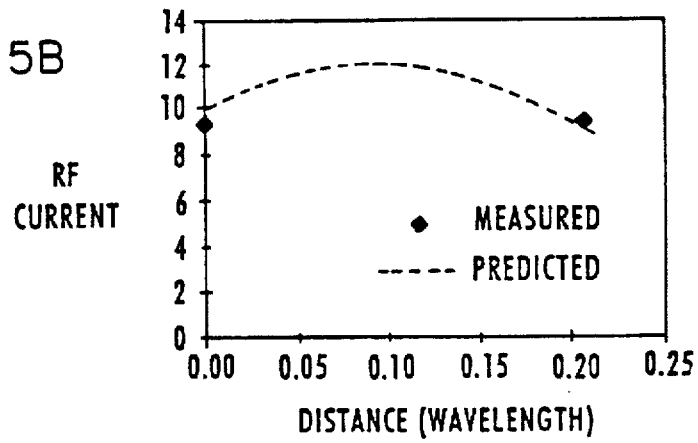
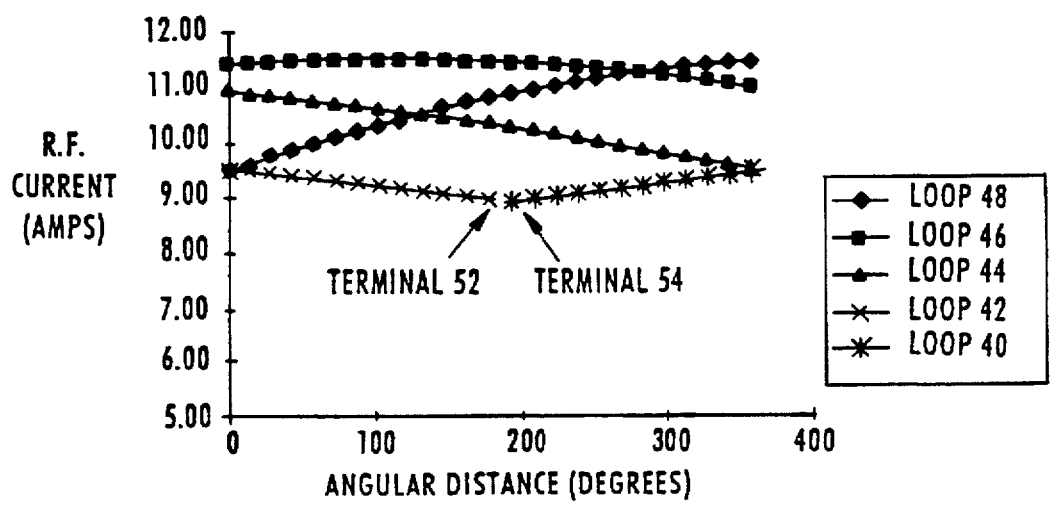
Figure 6

INDUCTIVELY COUPLED SOURCE FOR DERIVING SUBSTANTIALLY UNIFORM PLASMA FLUX

FIELD OF INVENTION

The present invention relates generally to radio frequency (r.f.) vacuum plasma processors and more particularly to such a processor including a planar plural turn excitation coil having radially displaced arcuate segments with a geometry relative to a wavelength of an exciting r.f. source such that distributed r.f. currents and voltages in the coil are combined to produce an electromagnetic field that causes a substantially uniform spatial plasma flux to be produced on a processed workpiece.

BACKGROUND ART

Various structures have been developed to supply r.f. fields from devices outside of a vacuum chamber to excite a gas in a plasma processor to a plasma state. The r.f. fields have been derived from electric field sources including capacitive electrodes, electromagnetic field sources including electron cyclotron resonators, and induction, i.e., magnetic, field sources including coils. The excited plasma interacts with a workpiece in the chamber to etch the workpiece or to deposit material on it. The workpiece can be a semiconductor wafer having a planar circular surface or a solid dielectric, e.g., a rectangular glass substrate used in flat panel displays, or a metal plate.

A processor for treating workpieces with an inductively coupled planar plasma (ICPP) source is disclosed, inter alia, by Ogle, U.S. Pat. No. 4,948,458, commonly assigned with the present invention. In Ogle, the magnetic field that excites the plasma is derived from a planar coil positioned on or adjacent to a single planar dielectric window that extends in a direction generally parallel to the workpiece planar surface being processed. The coil is connected to be responsive to an r.f. source having a frequency in the range of 1 to 100 MHz (typically 13.56 MHz) and coupled to the coil by an impedance matching network. The coil is configured as a planar linear spiral having external and internal terminals connected to be responsive to the r.f. source. Coultas et al., U.S. Pat. No. 5,304,279 discloses a similar device employing plasma confinement using permanent magnets in combination with the planar spiral coil.

Cuomo et al., U.S. Pat. No. 5,277,751 and Ogle, U.S. Pat. No. 5,277,751 disclose variations of the aforementioned processors wherein the planar spiral coil is replaced by a solenoidal coil. The solenoidal coil is wound on a dielectric mandrel or the like and includes plural helical-like turns, a portion of which extend along the dielectric window surface. The remainder of the coil extends above the dielectric window. Opposite ends of the solenoidal coil are connected to an r.f. excitation source.

These inductive sources excite the plasma by heating electrons in the plasma region near the vacuum side of the dielectric window by oscillating inductive fields produced by the coil and coupled through the dielectric window. Inductive currents which heat the plasma electrons are derived from the r.f. magnetic fields produced by r.f. currents in the planar coil. The spatial distribution of the magnetic field is a function of the sum of the fields produced by each of the turns of the coil. The field produced by each of the turns is a function of the magnitude of r.f. current in each turn. For the spiral design disclosed by the Ogle '458 patent, the r.f. currents in the spiral coil are distributed to produce a ring shaped region where power is absorbed by the plasma.

The ring shaped region abuts the vacuum side of the dielectric window. At low pressures, in the 1.0 to 10 mTorr range, diffusion of the plasma from the ring shaped region produces a plasma density peak in a central portion of the chamber, along a chamber center line away from the window. At intermediate pressure ranges, in the 10 to 100 mTorr range, gas phase collisions of electrons, ions, and neutrons in the plasma prevent substantial diffusion of the plasma charged particles outside of the annular region. As a result there is a relatively high plasma flux in a ring like region of the workpiece but low plasma fluxes in the center and peripheral workpiece portions. Hence, there are substantially large plasma flux variations between the ring and the volumes inside and outside of the ring.

Chen et al., U.S. Pat. No. 5,226,967 considers the adverse effects of reduced plasma density at radial regions removed from the center of a planar spiral coil. In Chen '967, the strength of magnetic fields generated by the planar coil and coupled to the plasma decreases along the chamber center line. The decrease is provided by increasing the thickness of the dielectric window center portion, relative to the thickness of other regions of the window. At pressures up to about 20 mTorr, the increased thickness of the solid dielectric material extending into the plasma shifts the ring shaped region for r.f. power absorption to a larger radius. The shift of the ring shaped region position changes the diffusion characteristics of this plasma generation region so diffusion is more uniform across the entire processed substrate surface diameter, particularly at the peripheral portion of the substrate.

In the device of the '967 patent, an electromagnetic shield that supports the dielectric window decreases the plasma flux close to the center of the coil. This plasma flux density reduction occurs because the shield decreases coupling between the coil and an electromagnetic field resulting from the r.f. current applied to the coil. The magnetic fields produced by the largest diameter turn of the planar source frequently induce r.f. currents in the electromagnetic shield which supports the window, if the shield and largest turn are sufficiently close to each other. Power coupled to the shield results in (1) a decrease in the coupling efficiency of the r.f. excitation of the plasma and (2) a shift of the ring shaped power absorption region to a smaller diameter region since the magnetic field produced by the largest diameter turn of the coil does not couple as much magnetic flux to the plasma as the inner turns. Substantial uniformity up to about 20 mTorr occurs as a result of diffusion of charged particles into the region below the center of the coil, where the window is thickest. However, as pressure increases above about 20 mTorr, where charged particular diffusion decreases appreciably, the plasma flux beneath the center of the coil, where the r.f. excitation is small, decreases relative to the flux in the other regions beneath the coil. Hence, there is non-uniform plasma flux on different portions of the workpiece.

The ring shaped region over which a planar coil couples r.f. power to the plasma can be shifted to larger diameters by removing the inner turns of the planar spiral. Fukusawa et al. in an article entitled "RF Self-Bias Characteristics in Inductively Coupled Plasma," Japanese Journal of Applied Physics, Vol. 32 (1993), pages 6076–6079, Part 1, No. 12(B), December 1993, discloses a single turn planar spiral coil for exciting gases in a plasma processor to a plasma condition. The disclosed coil has inner and outer dimensions of 120 and 160 mm and is 0.5 mm thick and is located in the vicinity of the periphery of a dielectric plate which serves as the top of the vacuum vessel. The ostensible purpose of the one turn coil is to produce a uniform plasma density radial distribution. However, as illustrated in FIG. 6 of Fukusawa et al., the plasma density is not particularly uniform even at a relatively low plasma processor pressure of 10 milliTorr, particularly for the types of r.f. excitation power which are required for plasma etching, in the 1 kilowatt range. For 1 kilowatt r.f. excitation of the single turn source, disclosed by Fukusawa et al., the plasma produces a substantial plasma density peak (of $7.5 \times 10^{11}$ ions $cm^{-3}$), at a position approximately 4.0 centimeters from the center of the chamber. This peak occurs only on one side of the center axis, creating a significant non-radial asymmetry in the spatial distribution of the plasma. The one-turn spiral disclosed by Fukusawa et al. results in a shift in the coupling region to a larger diameter relative to the full spiral disclosed by Ogle in the '458 patent. The Fukusawa et al. devices also exhibit a nonradial asymmetry which equals or exceeds the radial nonuniformity in the spatial distribution of the plasma density generated by a full spiral. The range of pressures over which the one turn coil can be operated is also limited since this coil relies on diffusion to shift plasma from the ring shaped plasma generation region near the periphery of the chamber to the center of the chamber. At pressures above 10 milliTorr, collisions of charged and uncharged particles in the plasma result in a severe decrease in plasma density in the center region of the chamber.

The Invention

In accordance with one aspect of the present invention, a vacuum plasma processor has a coil with plural arcuate turns for exciting gas in the processor to a plasma state in response to r.f. energization of the coil. The coil includes interior and exterior radially displaced segments and is arranged so the magnetic flux derived from outer segment is greater than the magnetic flux derived from the center portion of the coil. The spatial distribution of the magnetic flux derived from the improved coil is arranged to substantially eliminate nonradial asymmetries in the spatial distribution of the plasma compositions (or composition) which interact(s) with the workpiece. The spatial arrangement of the magnetic flux of the coil is able to excite spatially uniform plasma fluxes for pressures between 1 and 100 mTorr. The vacuum chamber is optimized to reduce coupling of magnetic flux from peripheral portions of the coil to an electromagnetic shield.

The coil has sufficient length at the frequency (i.e., the wavelength) of the r.f. source to generate a significant standing wave pattern along the length of the coil due to transmission line effects. Because of the transmission line effects at least one r.f. current maximum exists in the coil at some point along the geometric length of the coil. The magnetic flux (which in turn generates the induction field for exciting the plasma) produced by each coil segment is proportional to the magnitude of the r.f. current occurring in the segment. As a result, a single loop connected to an r.f. supply is expected to produce a nonradial maximum in the plasma density at a position corresponding to the location of the coil r.f. current maximum. This type of nonradial maximum is seen in the Fukusawa et al. data. For a coil with plural ring segments, the plasma density spatial distribution is a function of both the geometries of the segments and the level of r.f. current occurring in each segment. For the multiple element spiral coil disclosed by the Ogle '458 patent, the spatial average of the magnetic flux produces a plasma with ring shaped plasma generation region near the center of the vacuum side of the dielectric window. Only a small degree of nonradial asymmetry is produced by the r.f. current maximum occurring in one portion of the spiral.

In the improved planar coil of the present invention, the interior and exterior coil segments are positioned and arranged so the magnetic fluxes from different regions of at least some pairs of adjacent coil turns are additive. Because these different regions are adjacent each other, the magnetic fluxes from them add and average to a value which produces a uniform plasma flux across the workpiece processed surface. The elements of the coil are arranged to produce a greater degree of magnetic flux from the outer turns relative to the magnetic flux produced by the inner turns. By providing maximum magnetic flux in the outer turns and minimum flux in the smaller diameter, inner turns, the outer diameter of the ring shaped plasma generation region is extended. The proper choice of diameter size for each of these segments results in a planar coil which produces a plasma generation region which diffuses to and uniformly interacts with the workpiece processed surface. The diameters of these ring segments are arranged to produce this uniform flux across the workpiece processed surface over a wider range of operating pressures, typically from 1 milliTorr to 100 milliTorr.

The production of a uniform plasma flux on the workpiece processed surface requires correct selection of the aspect ratio of the chamber, i.e., the ratio of cylindrical chamber diameter to the distance between the workpiece processed surface and the bottom of the dielectric plate (the top of the chamber). At the correct aspect ratio, the ring shaped plasma at the top of the chamber diffuses to the workpiece surface so there is a spatially uniform plasma flux on the workpiece processed surface. To this end, in one preferred embodiment, the chamber upper surface above which the coil is mounted consists of only a 14.7 inch diameter circular quartz plate window with a uniform thickness of 0.8 inches. The plasma chamber is a cylindrical vessel with a metal wall having a 14.0 inch inner diameter. The planar coil outer diameter is about 12 inches. The resulting one inch gap between the bottom face of the coil and the top face of the chamber (defined by the bottom face of the quartz plate) prevents the magnetic flux in the outermost turn of the coil from being significantly coupled to the metal chamber wall. A metal electromagnetic shield enclosure which surrounds the planar coil is located beyond the chamber wall outer diameter so magnetic flux in the outermost turn of the coil is not significantly coupled to the shield enclosure. The cylindrical shape of the plasma vessel assists in producing a uniform plasma flux on the workpiece processed surface. The spacing of the workpiece from the plasma generation region is optimized to produce a uniform flux on the workpiece processed surface over a wide range of operating pressures. For the coil and chamber diameters listed above, the spacing between the vacuum side of the dielectric plate and the upper, processed workpiece surface is about 4.7 inches.

Because of the transmission line effects of the coil, a spatially averaged r.f. current is produced in the coil to provide uniform plasma excitation over a wide range of operating pressures.

The amount of capacitive coupling from the coil to the plasma is sufficiently low that there is no appreciable degradation in the uniformity of plasma flux on the workpiece processed surface. A small amount of capacitive coupling in a predominantly inductively coupled plasma source has been found to be beneficial to the operation of the discharge. Capacitive coupling of the r.f. voltage on the coil to the plasma through the dielectric plate is required to (1) initiate the plasma discharge and (2) stabilize a steady state plasma discharge. This is because the capacitive coupling introduces a small amount of higher energy electrons in the predominantly low energy inductive discharge. To provide this degree of capacitive coupling without degrading the overall coupling of the coil to the plasma, the coil r.f. voltage spatial distribution is optimized. In one embodiments capacitive coupling optimization is primarily accomplished by exciting the coil so it has capacitive coupling peaks (i.e. the points with the highest r.f. voltages) at terminals of the coil in the coil center. These terminals are connected to the r.f. excitation source.

The above and still further objects, features and advantages of the present invention will become apparent upon consideration of the following detailed description of a specific embodiment thereof, especially when taken in conjunction with the accompanying drawings.

BRIEF DESCRIPTION OF THE DRAWING

FIGS. 5A and 5B are plots of the measured and calculated r.f. voltages and currents respectively occurring in the planar coil of FIGS. 2A and 2B during excitation of the plasma in the chamber of FIG. 1; and FIG. 6 is a plot of the calculated r.f. currents occurring on each segment of the planar coil of FIGS. 2A and 2B as a function of angular distance measured in the plane of the coil.

DESCRIPTION OF THE PREFERRED EMBODIMENT

Figure 1:
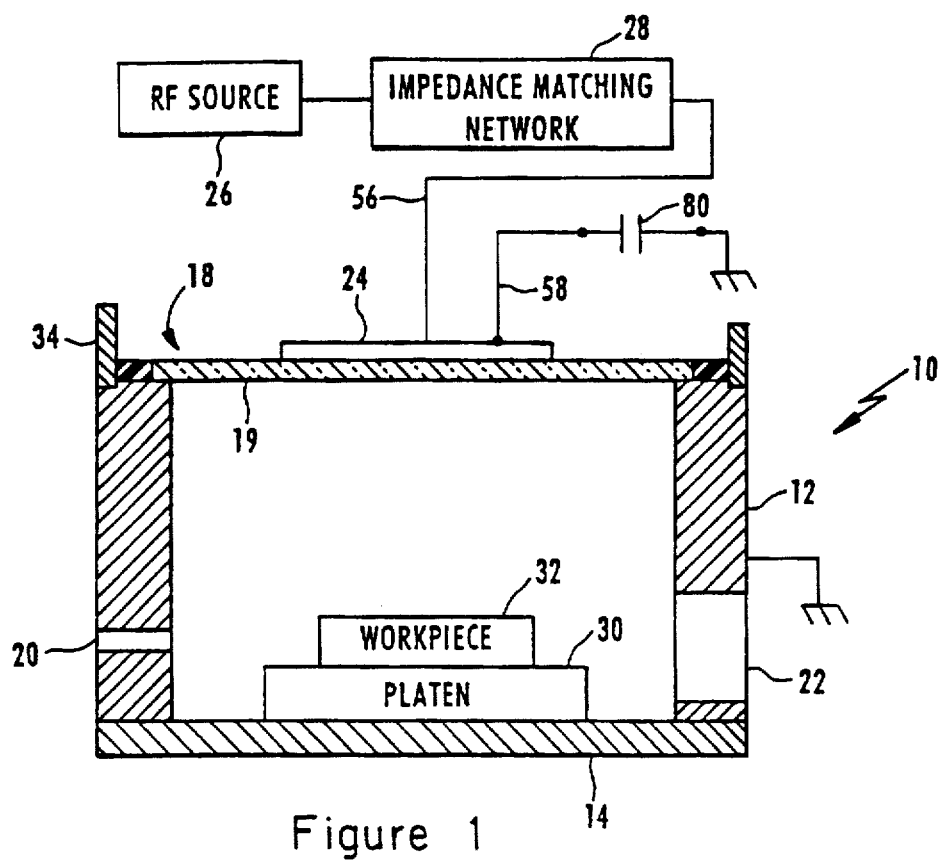
FIG. 1 is a schematic diagram of a vacuum plasma processor of the type employed with the present invention.

Reference is now made to FIG. 1 of the drawing, wherein a plasma workpiece processor that can be used for etching a semiconductor, dielectric or metal substrate or for depositing molecules on the substrate is illustrated as including vacuum chamber 10, shaped as a cylinder having grounded metal wall 12, metal bottom end plate 14, and a circular top plate structure 18, consisting of a dielectric window structure 19, having the same thickness from its center to its periphery. Sealing of the vacuum chamber 10 is provided by conventional gaskets (not shown).

A suitable gas that can be excited to a plasma state is supplied to the interior of chamber 10 from a gas source (not shown) via port 20 in side wall 12. The interior of the chamber is maintained in a vacuum condition, at a pressure that can vary in the range of 1–100 milliTorr, by a vacuum pump (not shown), connected to port 22 in the side wall 12. Alternatively, port 22 is located in the end plate 14. The gas in the chamber is excited to a spatially uniform plasma state by a suitable electric source. The electric source includes a substantially planar coil 24, usually mounted immediately above window 19 and excited by r.f. power source 26 via impedance matching network 28. Typically, r.f. source 26 has a frequency of 13.56 MHz. Workpiece 32 is fixedly mounted in chamber 10 to the surface of a substrate platen 30 which is parallel to the surface of window 19. Workpiece 32 is electrostatically clamped to the surface of substrate platen 30 by use of a DC potential provided by a DC power supply (not shown).

Surrounding planar coil 24 and extending above top end plate 18 is a metal tube or can-like shield 34, providing electromagnetic decoupling of the fields originating in coil 24 from the surrounding environment. The distance between shield 34 and the peripheral regions of coil 24 is large enough to prevent significant absorption by shield 34 of the magnetic fields generated by the peripheral regions of coil 24.

The diameter of cylindrically shaped chamber 10 is large enough to prevent the absorption by chamber walls 12 of the magnetic fields generated by the peripheral regions of coil 24. The diameter of dielectric window structure 19 is greater than the diameter of chamber 10 such that the entire upper surface of chamber 10 is comprised of dielectric window structure 19. The distance between the treated surface of workpiece 32 and the bottom surface of dielectric window structure 19 is chosen to provide the most uniform plasma flux on the exposed, processed surface of the workpiece. For the preferred embodiment of the invention, the distance between the workpiece processed surface and the bottom of the dielectric window is approximately 0.3 to 0.4 times the diameter of chamber 10.

The frequency of r.f. source 26 and the length of planar coil 24 between end terminals thereof connected to the source are such that the behavior of the r.f. voltages and currents occurring in the coil can be approximated using r.f. transmission line theory. The transmission line effects occur in the planar coil since each small section of the planar coil, in combination with the dielectric surrounding it, has a finite nonzero capacitance to the plasma. Hence each coil section forms an electrical device represented by distributed inductance and distributed capacitance along the length of the coil. The characteristic impedance of the transmission line formed by the planar coil is a function of the dimensions and shape, i.e., geometry, of the cross section of the conductive material which forms the planar coil, as well as the dielectric constant and thickness of the window material.

The behavior of the planar coil as a transmission line produces a standing wave pattern along the length of the coil which results in variations in the magnitude of the r.f. voltages and currents along the length of the coil. The dependence of the magnetic flux generated by the coil on the magnitude of these r.f. currents results in differing amounts of plasma being produced in different portions of chamber 10 beneath different portions of the coil. As a result, to derive a uniform plasma using a planar coil requires the variations in the r.f. current magnitude flowing in different parts of the coil to be spatially averaged. Spatially averaging these different current values in the different parts of the coil substantially prevents nonradial asymmetries in the plasma density, particularly at regions of high r.f. current in coil segments near the periphery of coil 24. The transmission line behavior of the r.f. current in planar coil 24 increases the amount of magnetic flux generated by the peripheral coil segments relative to the center coil segments. This result is achieved by exciting coil 24 with r.f. so the regions of maximum r.f. current are on the peripheral coil segments.

Figure 2A:
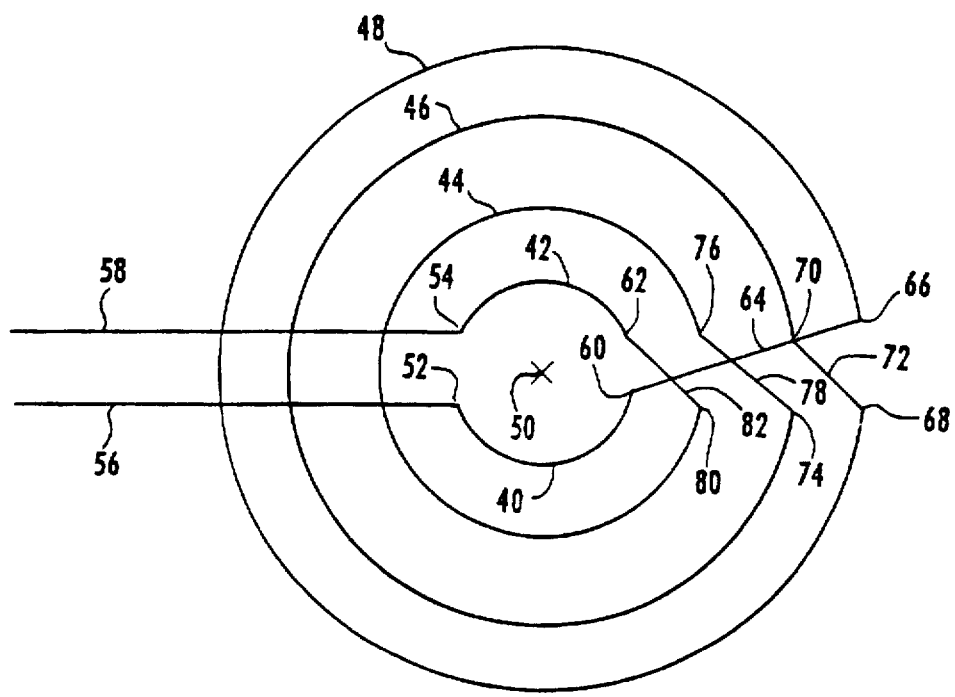
FIGS. 2A and 2B are respectively top and perspective views of a preferred embodiment of a planar coil included in the processor of FIG. 1, wherein the coil includes a split center portion, a set of ring elements near the periphery of the coil and a third ring element at an intermediate diameter.
Figure 2B:
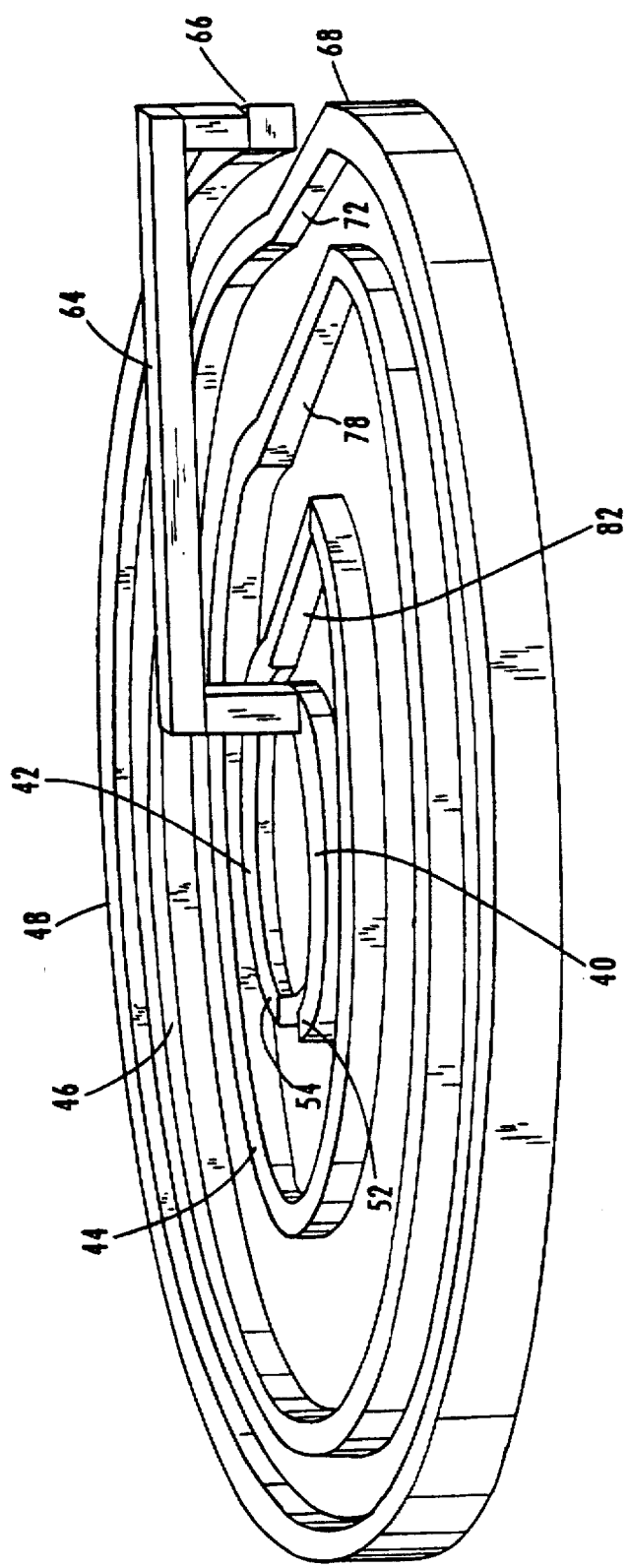

In the preferred embodiment, illustrated in FIGS. 2A and 2B, planar coil 24 includes interior substantially semicircular loops 40 and 42 and peripheral substantially circular segments 46 and 48 and an intermediate substantially circular segment 44. Loops 40 and 42 form half turns of coil 24, while each of loops 44, 46 and 48 forms almost a complete full turn; the full and half turns are connected in series with each other. All of segments 40, 42, 44, 46 and 48 are coaxial with central coil axis 50, coincident with the center axis of chamber 10. Opposite excitation terminals 52 and 54, in the center portion of coil 24, are respectively coupled by leads 58 and 56 to opposite terminals of r.f. source 26 via matching network 28 and one electrode of capacitor 80, the other electrode of which is grounded. Terminal 60, at the end of segment 40 opposite from terminal 52, is connected to end terminal 66 of outer loop segment 48 by conductive strap 64 which is located in a region slightly above the plane of coil 24 and does not touch any of the coil segments which run beneath it so the strap is electrically insulated from coil 24, except at terminals 60 and 66. Segment 48 has a second terminal 68 slightly less than 360° from terminal 66; terminal 68 is connected to terminal 70 of loop segment 46 via strap 72. Loop 46, having an angular extent of almost 360°, has a second end terminal 74 connected to terminal 76 of loop 44 via strap 78. Loop 44, having an angular extent of almost 360°, has a second end terminal 80 which is connected by strap 82 to terminal 62, at the end of segment 42 opposite from terminal 54.

The dimensions of substantially circular loop segments 44, 46 and 48 are determined by the wavelength of the r.f. voltage and current supplied by source 26 to coil 24 and by the dimensions of the workpiece. The wavelength of the r.f. in the coil is some fraction (typically 0.5–0.7) of the free space wavelength. In the preferred embodiment of coil 24, the diameter of workpiece 32 is less than the diameter of circular loop 46 but greater than the diameter of circular loop 44. In the preferred embodiment, the outermost loop segment 48 has a diameter approximately 0.0248 times the wavelength of the r.f. voltage and current in the coil. The diameter of loop segment 46 is approximately 0.0207 times this wavelength and the diameter of loop segment 44 is approximately 0.0146 times this wavelength. The equal radii of the semicircular ring segments 40 and 42 are approximately 0.00413 times the wavelength. The effective transmission line lengths for loop segments 48, 46, 44, 40 and 42 are respectively approximately 0.078, 0.065, 0.046, 0.013 and 0.013 times the wavelength of the r.f. current in the coil, so the total coil length is approximately 0.22 times the wavelength.

Capacitor 80, having a capacitive impedance, $Z_{cap}=1/(j2\pi fC)$, where $j=\sqrt{-1}$, f is the frequency of r.f. source 26, and C is the capacitance of capacitor 30, shifts the phase and therefore location of the voltage and current distribution across the entire length of coil 24. The voltage and current distribution are shifted in coil 24 so the coil produces r.f. electric and magnetic fields which provide uniform plasma flux on the processed surface of workpiece 32. For the preferred embodiment, the voltage and current of coil 24 are distributed by selecting the value of capacitor 80 so the peak-to-peak r.f. current at coil terminal 54 is a minimum and equals the peak-to-peak r.f. current at coil terminal 52. At this condition, the coil has opposite polarity maximum peak-to-peak r.f. voltages at terminals 52 and 54 and the coil maximum r.f. current occurs near conductive strap 72. The distribution of r.f. voltages and currents in the coil can be approximated by $$V_{pkpk}(X)=V^{o}_{pkpk}\cos[\beta(x+x^{o})] \text{ and}$$

$$I_{pkpk}(X)=I^{o}_{pkpk}\sin[\beta(x+x^{o})],$$

where:

x is the linear distance measured from input terminal 54 of the coil,

β is the angular frequency of r.f. source 26 (i.e. 2πf) divided by c, the speed of light, $x^{o}$ is an offset from zero which is determined by the value of the capacitor 80, and $V^{o}_{pkpk}$ and $I^{o}_{pkpk}$ are respectively the maximum r.f. peak-to-peak voltages and currents supplied to the coil. For the preferred embodiment of the coil, the value of capacitor 80 is selected so $x^{o}$ is approximately 0.15 to 0.16 times the wavelength (λ=c/f) of the r.f. current flowing in the coil. The distribution of the calculated and measured r.f. voltages and currents for the preferred embodiments of coil 24 are respectively shown in FIGS. 5A and 5B as a function of the length of the coil.

The magnetic flux produced by the peripheral regions of coil 24 is greater than the magnetic flux generated by the center region of the coil because the magnitude of the peak-to-peak r.f. currents is greater in the peripheral segment of the coil relative to the magnitudes of the peak-to-peak currents of the central segments. In the preferred embodiment, the maximum peak-to-peak r.f. current amplitude occurs in substantially circular loop segment 46. The amplitudes of the peak-to-peak r.f. currents in adjacent loop segments 44 and 48 and in loop segment 46 and the spacing of loop segments 44, 46 and 48 from each other are such that magnetic fluxes from these three loop segments are combined in space to provide a total magnetic flux density, just under window 19, having a maximum value over a relatively broad annular area, extending from between loop segments 46 and 48 to between intermediate segment 44 and interior segments 40 and 42. The total magnetic flux is also relatively constant as a function of an angular coordinate θ.

The angular coordinate, θ, represents the spatial angular displacement about the center axis of chamber 10 in the counter clockwise direction from a phantom line 100. Terminals 60, 80, 74 and 68 are angularly equidistant from and on one side of line 100 while terminals 62, 76, 70 and 66 are angularly equidistant by the same amount from and on the other side of line 100. Hence, e.g. coil segment 48 has a spatial angular extent of slightly less than 360° from an angle θ, which is slightly greater than θ=0°, to an angle $\theta_2$, which is slightly less than θ=360°; and terminals 52 and 54 are at angles $\theta_3$ and $\theta_4$ respectively slightly greater and slightly less than 180°. A spatially averaged magnetic flux which is constant along a particular coordinate value θ provides a plasma which is radially symmetric along θ. The amplitudes of the peak-to-peak r.f. currents in the two substantially semicircular, equal radius segments 40 and 42 are significantly less than the amplitudes of the currents in the other segments. Segments 40 and 42 derive sufficient magnetic fluxes which are spatially averaged with the magnetic fluxes derived from the other segments 44, 46 and 48 so a substantially uniform plasma flux is generated at the level of the processed surface of workpiece 32 across the diameter of the chamber. The amplitudes of the peak-to-peak r.f. currents in each of the segments are plotted in FIG. 6 as a function of angular distance θ.

From FIG. 6, the highest values of r.f. peak-to-peak current in coil 24 are (1) throughout loop segment 46, (2) the portion of loop segment 48 from terminal 68 (at the connection of segment 48 to segment 46 via strap 72) to an angle $\theta_4$, slightly less than θ=180°, i.e. for an angular extent of somewhat more than 180°, and (3) in the portion of loop segment 44 from terminal 76 (at the connection of segment 44 to segment 46 via strap 78) to $\theta_4$, i.e. for an angular extent of somewhat less than 180°. The lowest currents are at terminals 52 and 54 (where they are equal) and along interior loops 40 and 42. Because of this current distribution, the magnetic flux derived from the interior loop segments 40 and 42 of coil 24 is substantially less than the flux from exterior loop portions 46 and 48 to assist in providing uniform plasma flux on the workpiece.

The electrostatic (i.e., capacitive) coupling of the voltages occurring between different portions of planar coil 24 (for example between portions of loop segments 46 and 48 at the same angular coordinate position $\theta_i$) to the plasma has been found to have an influence on the uniformity of the generated plasma flux. The capacitive coupling of these voltages to the plasma depends on the magnitude of the peak-to-peak voltages occurring in the coil segments, as well as the thickness and dielectric material of window 19 which separates the coil from the plasma. In the preferred embodiment of the coil, the influence of the capacitive currents produced by the r.f. voltages is minimized by causing the highest r.f. peak-to-peak voltages to occur at terminals 52 and 54. Such a result occurs because of the geometry of coil 24 and by proper selection of the value of capacitor 80, connected in series with the coil. Interior equal length and equal radii semicircular segments 40 and 42 are oriented such that terminals 52 and 54 at the ends thereof are on diametrically opposite sides of line 100. Positioning terminals 52 and 54 at these locations minimizes the effect of these high r.f. peak-to-peak voltage points. This is because at any instant of time, the voltages at terminals 52 and 54 are substantially equal to each other in amplitude but have opposite polarity. This causes the effects of the two opposite polarity voltages to approximately cancel in the plasma. Dielectric window 19 is preferably quartz and is approximately 0.8 inches thick to minimize the electrostatic coupling of the r.f. voltages between different parts of coil 24 to the plasma while still providing sufficient coupling of the magnetic fields produced by the coil to the plasma.

R.f. excitation of planar coil 24 produces a substantially planar plasma having a relatively uniform flux completely across substrate 32, frequently shaped as a disc. Regardless of shape, substrate 32 has exterior edge dimensions only somewhat less than the interior dimensions of plasma processor chamber 10. Coil 24 is configured so the density of plasma flux incident on the processed surface of substrate 32 is within ±2.5% of the average plasma density across the substrate. This uniformity is achieved because the magnetic flux in the center portion of coil 24 is less than the magnetic flux derived from the peripheral and intermediate portions of the coil. The geometry and method of r.f. excitation of coil 24 provide a uniform plasma flux on the processed surface of substrate 32 for a range of pressures of 1 to 100 milliTorr.

Figure 3:
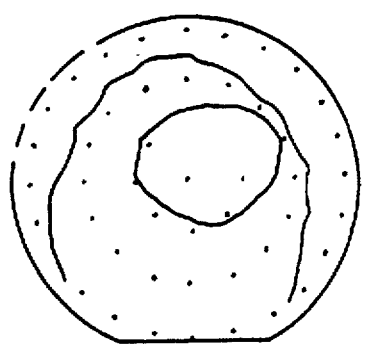
FIG. 3 is a plot of the spatial variations in the etch rate for a 200 mm wafer processed in the chamber of FIG. 1 by using the planar coil of FIGS. 2A and 2B.
Figure 4:
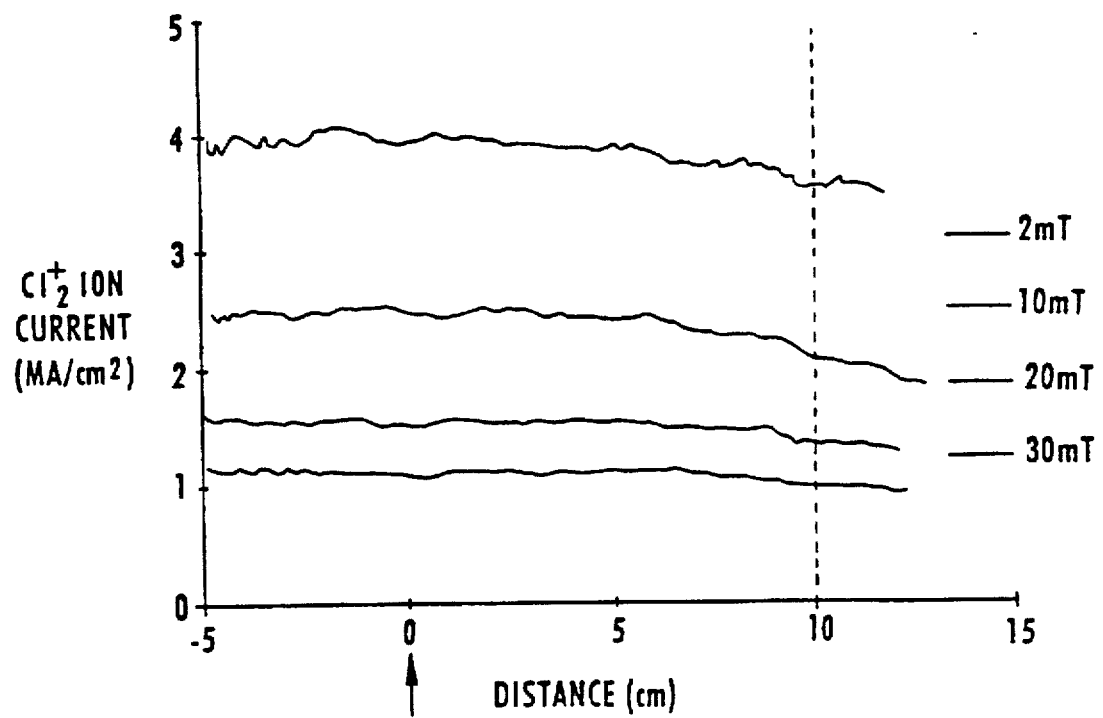
FIG. 4 are plots of the measured ion density uniformity produced by the coil of FIGS. 2A and 2B measured at a region near the surface of the workpiece for operating pressures between 2.0 and 30 milliTorr.

FIG. 3 is a plot of the measured ion current uniformity for the preferred embodiment of the plasma processor chamber 10 measured 1.0 centimeter above the surface of a 200 mm diameter disc shaped substrate for a variety of pressures in the range of 2.0 to 30.0 milliTorr. From FIG. 2, there is a plasma density uniformity within ±2.5% of the average plasma density across the substrate. FIG. 4 is a top view of a plot of the spatial variations in the etch rate for a 200 mm wafer semiconductor etched at 15 milliTorr using the described preferred embodiment of planar coil 24. From FIG. 4, the substrate is etched with a uniformity no less than 2.3%.

While there has been described and illustrated a specific embodiment of the invention, it will be clear that variations in the details of the embodiment specifically illustrated and described may be made without departing from the true spirit and scope of the invention as defined in the appended claims.

We claim:

1. A vacuum plasma processor for treating a workpiece in a vacuum chamber comprising a vacuum plasma processing chamber arranged to be responsive to a source of ionizable gas and including a holder for the workpiece, a coil reactively coupled with the gas for exciting the gas to a plasma state capable of processing workpieces on the holder, the coil having plural turns and exciting gas to the plasma state in response to r.f. energization of the coil, the coil including interior and exterior arcuate segments and first and second excitation terminals adapted to be connected to a source of the r.f. excitation, the first terminal being at one end of the coil and at one end of the interior arcuate segment, the exterior arcuate segment being radially displaced from the interior arcuate segment, the second terminal being at one of the arcuate segments different from the interior arcuate segment, the coil, chamber and workpiece being arranged to produce in the chamber a magnetic flux having substantially greater density in peripheral portions of the coil and chamber than in a center portion of the chamber and coil so a substantially uniform plasma flux is incident on a processed surface of the workpiece, one of the terminals of the coil being connected to the source of the r.f. energization by a reactance, the value of the reactance, the length of the coil and the r.f. energization having a frequency such that peak-to-peak r.f. voltages $V_{pkpk}(x)$ and currents $I_{pkpk}(x)$ in the coil are approximated by $$V_{pkpk}(x)=V^o_{pkpk}\cos[\beta(x+x^o)] \text{ and } I_{pkpk}(x)=I^o_{pkpk}\sin[\beta(x+x^o)],$$

where:

x is the linear distance measured from an input terminal of the coil connected to the source, β is a constant determined by the frequency of the r.f. energization, $x^o$ is an offset from zero determined by the impedance of the reactance at the frequency of the r.f. energization, and $V^o_{pkpk}$ and $I^o_{pkpk}$ are values of the maximum r.f. peak-to-peak voltages and currents in the coil.

2. The vacuum processor of claim 1 wherein a source of the r.f. source is connected to first and second terminals of the coil such that the magnitude of the peak-to-peak r.f. voltage has a maximum value with a first polarity at the first terminal of the coil and a maximum value with a second polarity at the second terminal of the coil.

3. The vacuum processor of claim 1 wherein the coil includes several arcuate segments having an arcuate extent of about a turn, including an outermost arcuate segment having an arcuate extent of about a turn and a next outermost arcuate segment having an arcuate extent of about a turn, the r.f. energization being connected to the coil and the coil being configured such that r.f. current in the outermost arcuate segment and the next outermost arcuate segment is substantially greater than current in an interior segment of the coil.

4. The vacuum processor of claim 1 wherein a source of the r.f. energization is connected to first and second terminals of the coil and the coil is such that the magnitude of peak-to-peak r.f. current at the first terminal is approximately equal to the peak-to-peak r.f. current at the second terminal, the equal currents at the first and second terminals having amplitudes lower than any other currents in the coil.

5. The vacuum processor of claim 1 further including a reactance connected in series with the coil and a source of the r.f. excitation, the reactance having a value and connections to the coil and source and the coil having a configuration so there are approximately equal magnitude peak-to-peak r.f. currents at excitation terminals of the coil.

6. The vacuum processor of claim 1 wherein first and second excitation terminals of the coil are located in a center region of the coil, the first and second excitation terminals being respectively connected to first and second arcuate segments having an arcuate extent of about one half a turn, the arcuate segments having an arcuate extent of about one half a turn having about the same dimensions and arranged substantially concentrically such that the first and second terminals are located next to each other.

7. The vacuum processor of claim 6 wherein each of the first and second arcuate segments having an arcuate extent of about one half a turn has an effective linear length of about 0.026 times the wavelength of r.f. current flowing in the coil.

8. The vacuum processor of claim 7 wherein the coil has an outermost arcuate turn having an effective length that is approximately 0.078 times the wavelength of r.f. current flowing in the coil and is connected in series to one of the segments having an arcuate extent of about one half a turn such that the instantaneous r.f. current flows in the same direction in both said one segments having an arcuate extent of about one half a turn and said outermost arcuate turn.

9. The vacuum processor of claim 8 wherein the outermost arcuate turn is connected to said one inner segment by a straight length of conductive strap electrically insulated from the coil except at its ends.

10. The vacuum processor of claim 7 wherein the coil includes first and second additional substantially concentric arcuate segments each having an arcuate extent of about a turn and connected in series to the outermost arcuate segment, the additional substantially concentric arcuate segments having effective lengths approximately 0.065 times the wavelength of the current flowing in the coil and approximately 0.046 times the wavelength of the current flowing in the coil.

11. The vacuum processor of claim 6 wherein the first and second excitation terminals of the coil are terminals of innermost arcuate segments of the coil having an arcuate extent of about one half a turn and respectively forming the first and second arcuate segments, the innermost arcuate segments being located on diametrically opposite sides of a centerline which cuts the coil in half, the coil being arranged and connected to the r.f. excitation source so instantaneous r.f. voltages at the first and second excitation terminals have substantially equal magnitude but are of opposite polarity.

12. A vacuum plasma processor for treating a workpiece in a vacuum chamber comprising a vacuum plasma processing chamber arranged to be responsive to a source of ionizable gas and including a holder for the workpiece, a coil reactively coupled with the gas for exciting the gas to a plasma state capable of processing workpieces on the holder, the coil having plural turns and exciting gas to the plasma state in response to r.f. energization of the coil, the coil including interior and exterior arcuate segments and first and second excitation terminals adapted to be connected to a source of the r.f. excitation, the first terminal being at one end of the coil and at one end of the interior arcuate segment, the exterior arcuate segment being radially displaced from the interior arcuate segment, the second terminal being at one of the arcuate segments different from the interior arcuate segment, the coil, chamber and workpiece being arranged to produce in the chamber a magnetic flux having substantially greater density in peripheral portions of the coil and chamber than in a center portion of the chamber and coil so a substantially uniform plasma flux is incident on a processed surface of the workpiece, the net magnetic field generated by an outermost arcuate turn of the coil and a next outermost arcuate turn of the coil being substantially the same for all angular orientations and radii in the vicinity of the two outermost coils.

13. A vacuum plasma processor for treating a workpiece in a vacuum chamber comprising a vacuum plasma processing chamber arranged to be responsive to a source of ionizable gas and including a holder for the workpiece, a coil reactively coupled with the gas for exciting the gas to a plasma state capable of processing workpieces on the holder, the coil having plural turns and exciting gas to the plasma state in response to r.f. energization of the coil, the coil including interior and exterior arcuate segments and first and second excitation terminals adapted to be connected to a source of the r.f. excitation, the first terminal being at one end of the coil and at one end of the interior arcuate segment, the exterior arcuate segment being radially displaced from the interior arcuate segment, the second terminal being at one of the arcuate segments different from the interior arcuate segment, the coil, chamber and workpiece being arranged to produce in the chamber a magnetic flux having substantially greater density in peripheral portions of the coil and chamber than in a center portion of the chamber and coil so a substantially uniform plasma flux is incident on a processed surface of the workpiece, an outermost arcuate turn of the coil and a next outermost arcuate turn of the coil having a net electrostatic coupling of r.f. voltages to the plasma that is small relative to the net electrostatic coupling of r.f. voltages to the plasma by inner arcuate segments of the coil.

14. An r.f. vacuum plasma processor for treating a workpiece in a vacuum chamber with a plasma that is adapted to be excited by a source having an r.f. frequency, the processor comprising a coil reactively coupled with a gas in the chamber to excite the gas to the plasma, the coil having first and second excitation terminals and plural turns, the coil being arranged to excite gas in the chamber to a plasma state in response to energization of the coil by the r.f. source, a circuit connected to the excitation terminals and adapted to be connected to the source, the coil having a length between the terminals and the circuit being such that there are substantial current and voltage variations at the r.f. frequency along the coil length, the circuit elements and the coil geometry being such that the current has a relatively low peak-to-peak value in proximity to the excitation terminals and relatively high values in portions of the coil removed from the excitation terminals.

15. The vacuum plasma processor of claim 14 wherein the coil includes peripheral and interior portions, the peripheral and interior portions being radially displaced from each other, the excitation terminals being at the interior portions of the coil, the peripheral portions being the portion removed from the excitation terminals.

16. The vacuum plasma processor of claim 14 wherein the coil includes first and second interior segments and another portion outside the interior segments, each interior segment having a further terminal connected to said another portion, the excitation terminals being at portions of the interior segments displaced substantially from the further terminals.

17. The vacuum plasma processor of claim 16 wherein said another portion includes series connected plural turns, one of the turns being a peripheral turn having a first terminal, another of the turns being an intermediate turn having a second terminal, the first terminal being connected to said further terminal of one of the interior segments, the second terminal being connected to said further terminal of the other interior segment.

18. The vacuum plasma processor of claim 17 wherein another of the turns is a further turn located between and connected to the intermediate and peripheral turns.

19. The vacuum plasma processor of claim 18 wherein the coil is designed to be used with a workpiece having a circular surface to be processed, the circular surface having a predetermined diameter, the chamber and coil having common axes of symmetry, the chamber being arranged so the center of the workpiece is adapted to be located on the axes, the intermediate and further turns respectively having diameters greater and less than the workpiece diameter.

20. The vacuum plasma processor of claim 14 wherein the chamber and coil are arranged so there is a substantially uniform plasma flux across an entire processed surface of the workpiece.

21. The vacuum plasma processor of claim 14 wherein the circuit elements and the coil geometry are such that r.f. current flowing in the coil has peak-to-peak equal values at the excitation terminals, the current having minimum values at the excitation terminals and higher values in the portions of the coil removed from the excitation terminals, the peak-to-peak r.f. voltage having a maximum value at the excitation terminals.

22. The vacuum processor of claim 14 wherein the coil is connected to the source of the r.f. energization by a reactance, the value of the reactance included in the circuit, the length of the coil and the r.f. energization having a frequency such that peak-to-peak r.f. voltages $V_{pkpk}(x)$ and currents $I_{pkpk}(x)$ in the coil are approximated by $$V_{pkpk}(x)=V^o_{pkpk}\cos[\beta(x+x^o)] \text{ and } I_{pkpk}(x)=I^o_{pkpk}\sin[\beta(x+x^o)],$$

where:

x is the linear distance measured from an input terminal of the coil connected to the source, $\beta$ is a constant determined by the frequency of the r.f. energization, $x^o$ is an offset from zero determined by the impedance of the reactance at the frequency of the r.f. energization, and $V^o_{pkpk}$ and $I^o_{pkpk}$ are values of the maximum r.f. peak-to-peak voltages and currents in the coil.

23. The r.f. vacuum plasma processor of claim 14 wherein the portions of the coil removed from the excitation terminals are peripheral portions of the coil.

24. An r.f. vacuum plasma processor for treating a workpiece in a vacuum chamber with a plasma that is adapted to be excited by a source having an r.f. frequency, the processor comprising a coil reactively coupled with a gas in the chamber to excite the gas to the plasma, the coil having first and second excitation terminals and plural turns, the coil being arranged to excite gas in the chamber to a plasma state in response to energization of the coil by the r.f. source, a circuit connected to both of the excitation terminals and adapted to be connected to the source, the coil having a length between the terminals and the circuit being such that there are substantial current and voltage variations at the r.f. frequency along the coil length, both of the excitation terminals being at the interior portions of the coil.

25. The vacuum plasma processor of claim 24 wherein the coil includes first and second interior segments and another portion outside the interior segments, each interior segment having a further terminal connected to said another portion, the excitation terminals being at portions of the interior segments displaced substantially from the further terminals.

26. The vacuum plasma processor of claim 25 wherein said another portion includes series connected plural turns, one of the turns being a peripheral turn having a first terminal, an other of the turn s being an intermediate turn having a second terminal, the first terminal being connected to said further terminal of one of the interior segments, the second terminal being connected to said further terminal of the other interior segment.

27. The vacuum plasma processor of claim 26 wherein another of the turns is a further turn located between and connected to the intermediate and peripheral turns.

28. The vacuum plasma processor of claim 27 wherein the coil is designed to be used with a workpiece having a circular surface to be processed, the circular surface having a predetermined diameter, the chamber and coil having common axes and symmetry, the chamber being arranged so the center of the workpiece is adapted to be located on the axes, the intermediate and further turns respectively having diameters greater and less than the workpiece diameter.

29. The vacuum plasma processor of claim 24 wherein the chamber and coil are arranged so there is a substantially uniform plasma flux across an entire processed surface of the workpiece.

30. The vacuum plasma processor of claim 24 wherein elements of the circuit and the coil geometry are such that r.f. current flowing in the coil has peak-to-peak equal values at the excitation terminals, the current having minimum values at the excitation terminals and higher values in the peripheral portions of the coil, the peak-to-peak r.f. voltage having a maximum value at the excitation terminals.

31. The vacuum processor of claim 24 wherein the coil is connected to the source of the r.f. energization by a reactance, the value of the reactance included in the circuit, the length of the coil and the r.f. energization having a frequency such that peak-to-peak r.f. voltages $V_{pkpk}(x)$ and currents $I_{pkpk}(x)$ in the coil are approximated by $$V_{pkpk}(x)=V^o_{pkpk}\cos[\beta(x+x^o)] \text{ and } I_{pkpk}(x)=I^o_{pkpk}\sin[\beta(x+x^o)],$$

where:

x is the linear distance measured from an input terminal of the coil connected to the source, $\beta$ is a constant determined by the frequency of the r.f. energization, $x^o$ is an offset from zero determined by the impedance of the reactance at the frequency of the r.f. energization, and $V^o_{pkpk}$ and $I^o_{pkpk}$ are values of the maximum r.f. peak-to-peak voltages and currents in the coil.

* * * * *